(12) United States Patent
Lasser

(10) Patent No.: US 9,859,013 B2
(45) Date of Patent: Jan. 2, 2018

(54) DATA OPERATIONS IN NON-VOLATILE MEMORY

(71) Applicant: SANDISK TECHNOLOGIES LLC, Plano, TX (US)

(72) Inventor: Menahem Lasser, Kohav-Yair (IL)

( * ) Notice: Subject to any disclaimer, the term of this patent is extended or adjusted under 35 U.S.C. 154(b) by 88 days.

(21) Appl. No.: 14/270,757

(22) Filed: May 6, 2014

(65) Prior Publication Data

US 2015/0325290 A1 Nov. 12, 2015

(51) Int. Cl.
*G11C 16/34* (2006.01)
*G11C 13/00* (2006.01)

(52) U.S. Cl.
CPC ...... *G11C 16/3418* (2013.01); *G11C 13/0002* (2013.01); *G11C 13/0033* (2013.01); *G11C 13/0069* (2013.01); *G11C 2213/71* (2013.01)

(58) Field of Classification Search
CPC ............ G11C 16/3418; G11C 13/0033; G11C 13/0002; G11C 13/0069; G11C 2213/71
USPC .................................................. 365/148, 222
See application file for complete search history.

(56) References Cited

U.S. PATENT DOCUMENTS

| | | | | | |
|---|---|---|---|---|---|
| 5,873,112 | A | * | 2/1999 | Norman | G11C 16/10 257/E27.103 |
| 5,883,960 | A | * | 3/1999 | Maruyama | H04L 63/0853 380/249 |
| 6,563,745 | B1 | * | 5/2003 | Ilkbahar | G11C 16/10 365/189.02 |
| 7,869,258 | B2 | | 1/2011 | Scheuerlein et al. | |
| 8,520,425 | B2 | | 8/2013 | Xiao et al. | |
| 2003/0236944 | A1 | * | 12/2003 | Thompson | G06F 3/0605 711/114 |
| 2005/0243626 | A1 | * | 11/2005 | Ronen | G11C 11/406 365/222 |
| 2010/0085821 | A1 | * | 4/2010 | Ahn | G06F 12/0238 365/189.16 |
| 2010/0165689 | A1 | * | 7/2010 | Rotbard | G11C 11/56 365/45 |
| 2010/0195372 | A1 | * | 8/2010 | Toda | G11C 11/56 365/148 |
| 2010/0246247 | A1 | * | 9/2010 | Kim | G11C 13/0004 365/163 |
| 2011/0141832 | A1 | * | 6/2011 | Balakrishnan | G11O 5/02 365/189.16 |
| 2012/0075947 | A1 | * | 3/2012 | Kang | G11C 11/40618 365/222 |
| 2012/0099389 | A1 | * | 4/2012 | Park | G11C 11/40618 365/200 |
| 2012/0144105 | A1 | * | 6/2012 | Dodson | G11C 11/40603 711/106 |

(Continued)

OTHER PUBLICATIONS

Sharon, Eran et al. "Systems and Methods of Shaping Data," U.S. Appl. No. 14/136,740, filed Dec. 20, 2013, 38 pages.

(Continued)

*Primary Examiner* — Vu Le
*Assistant Examiner* — Sung Cho
(74) *Attorney, Agent, or Firm* — Kunzler, PC

(57) ABSTRACT

A method includes receiving an in-place refresh command to refresh data at a particular location in a non-volatile memory. The method also includes re-writing the data into the particular location of the non-volatile memory to refresh the data at the particular location in response to the in-place refresh command.

69 Claims, 8 Drawing Sheets

(56) References Cited

U.S. PATENT DOCUMENTS

| | | | |
|---|---|---|---|
| 2012/0195101 A1* | 8/2012 | Toda | G11C 11/56 365/148 |
| 2012/0233377 A1* | 9/2012 | Nomura | G06F 12/0893 711/3 |
| 2012/0271982 A1* | 10/2012 | Callaghan | G11C 16/10 711/103 |
| 2014/0016422 A1* | 1/2014 | Kim | G11C 11/402 365/222 |
| 2014/0059268 A1* | 2/2014 | Adachi | G06F 12/00 711/102 |
| 2014/0153315 A1* | 6/2014 | Kwon | G11C 13/0033 365/148 |
| 2014/0157065 A1* | 6/2014 | Ong | G11C 29/12 714/718 |
| 2015/0364188 A1* | 12/2015 | Lee | G11C 13/004 365/148 |

OTHER PUBLICATIONS

Chen, Yi-Chung et al. "3D-ICML: A 3D Bipolar Reram Design With Interleaved Complementary Memory Layers," Design, Automation & Test in Europe Conference & Exhibition, Mar. 14-18, 2011, 4 pages.

Kreupl, Franz, DR. "Material and Design Aspects of Reram Technology," Department of Hybrid Electronic Systems, Technische Universität, Munich, Germany, Mar. 5, 2013, pp. 1-31.

* cited by examiner

DATA OPERATIONS IN NON-VOLATILE MEMORY

FIELD OF THE DISCLOSURE

The present disclosure is generally related to storing and refreshing data in non-volatile memory.

BACKGROUND

A popular non-volatile solid state memory in use today is flash memory (both NAND and NOR types). Flash memory is characterized by not being "write-symmetric" when writing data. To illustrate, each cell of a flash memory can be written from a value of "1" to a value of "0" independently of other cells. However, to change a cell back to a value of "1" a relatively large group of cells (called an "erase block") are set to a "1" value as a group. An erase group might contain hundreds of kilobytes or even several megabytes, and flash management systems that manage frequent updates of small chunks of data may implement relatively complex logic to preserve valid data that may be stored at other locations in the erase block.

In recent years several new "write-symmetric" non-volatile memory technologies have been introduced that do not have the non-symmetry as described for flash memory, such as Resistive RAM (also known as RRAM or ReRAM), and Magnetic RAM (also known as MRAM), as illustrative examples. In these technologies, a cell may be written in both directions—from "1" to "0" and from "0" to "1" without imposing a similar operation on cells that neighbor the cell being written. As a result, it is possible to directly over-write a page of ReRAM or MRAM memories with new data regardless of the previous contents of the written page, something that is not possible with flash memories. Resistance-based non-volatile memories and other new "write-symmetric" non-volatile memories may significantly differ from other non-volatile memories, such as flash memories, in other structural and operational respects.

SUMMARY

A non-volatile memory, such as a resistive random access memory (ReRAM), is disclosed. Each storage element of the non-volatile memory may have a property (e.g., a resistance) that can be programmed to cause the storage element to be associated with a data value (e.g., a "0" value or a "1" value, or a "set" state or a "reset" state). The non-volatile memory may be configured to refresh or to over-write stored data to compensate for disturb effects.

To illustrate, upon programming, a property associated with a storage element (e.g., a set state) may be centered (or approximately centered) in a target state distribution. Over time, disturb effects caused by external disturbances (e.g., writing to neighboring storage elements) or by internal conditions (e.g., temperature change within the storage element) may cause the state to "drift" toward a boundary associated with another state (e.g., a reset state). If the state is maintained at the storage element for a certain time duration, such as when no write operation occurs at the storage element over the time duration, the drift may cause data corruption. Further, certain devices cannot in some cases "over-write" some states at the storage element during a write operation. For example, a device may be configured to "skip" writing a set state to a storage element that has a set state, to skip writing a reset state to a storage element that has a reset state, or both. Consequently, a state of a storage element may be disturbed without being corrected by subsequent over-writes, potentially causing bit errors and data loss.

A non-volatile memory in accordance with an embodiment of the present disclosure may compensate for disturb effects by refreshing data. For example, the non-volatile memory may receive an in-place refresh command. In response to the in-place refresh command, the non-volatile memory may refresh data "in-place" by re-writing the data to refresh the data. In this example, by refreshing the data, bit corruption and data loss due to disturb effects can be prevented or reduced using a simplified technique. For example, an in-place refresh of data may be simplified as compared to an out-of-place refresh of data, which may include updating a logical-to-physical mapping table. Further, the in-place refresh command may enable an in-place refresh of data using a single command, which simplifies the refresh as compared to using multiple commands (e.g., read and write commands).

A non-volatile memory in accordance with another embodiment of the present disclosure may support a "write all" operation that compensates for disturb effects. For example, in a memory that is configured to skip writing values to storage elements that already contain the values, the write-all operation may be selected to cause the storage elements to be written rather than skipped, to return the storage elements to a "fresh" state. Other aspects of the present disclosure are described further with reference to the Drawings and the Detailed Description.

DETAILED DESCRIPTION

Figure 1:
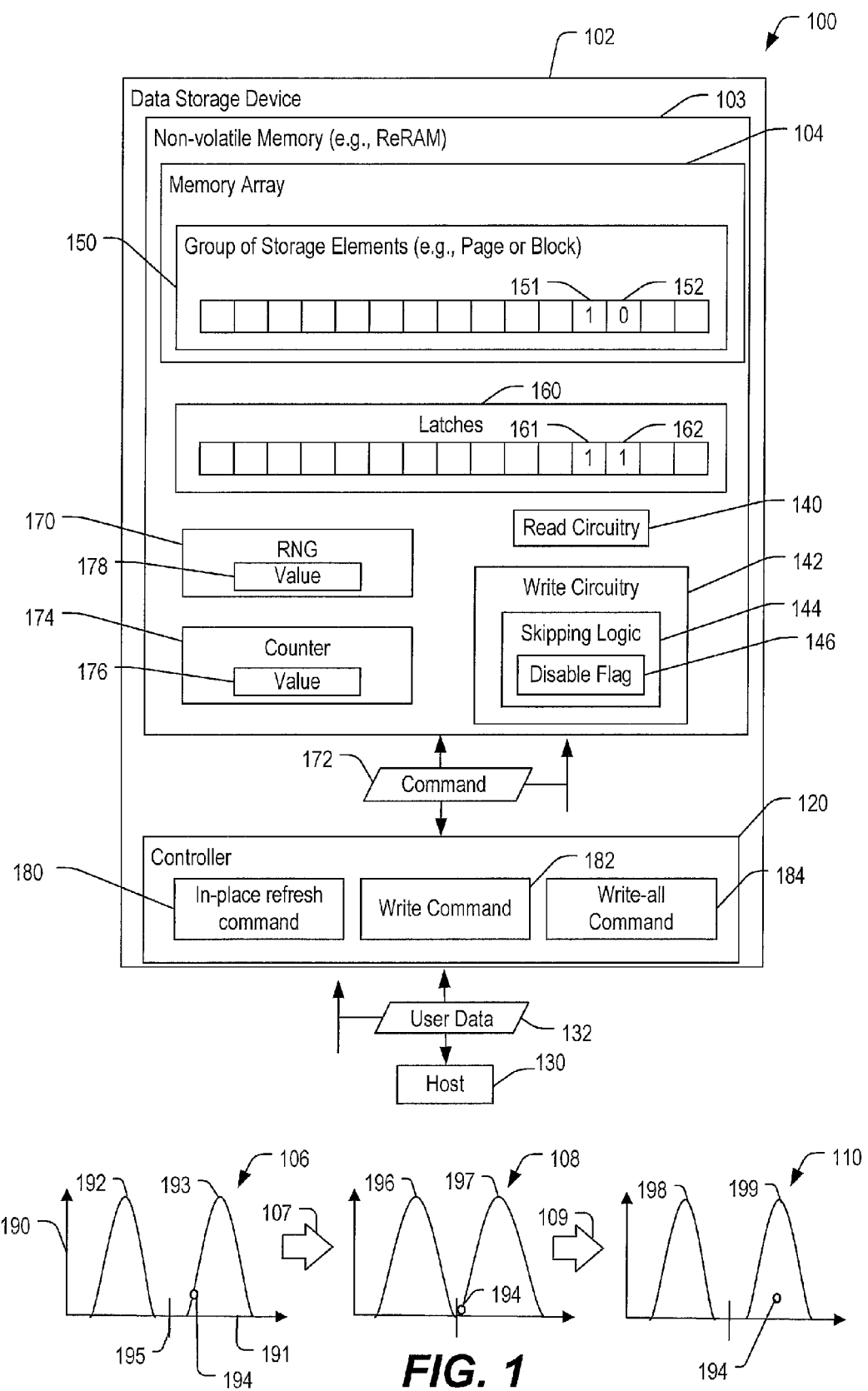
FIG. 1 is a block diagram of a particular illustrative embodiment of a system including a data storage device.

Referring to FIG. 1, a particular embodiment of a system 100 includes a data storage device 102 coupled to an accessing device, such as a host device 130. The data storage device 102 includes a controller 120 and a non-volatile memory 103 that further includes a memory array 104. The non-volatile memory 103 may include a resistive random access memory (ReRAM).

The host device 130 may be configured to provide data, such as user data 132, to be stored at the non-volatile memory 103 or to request data to be read from the non-volatile memory 103. For example, the host device 130 may include a mobile telephone, a music player, a video player, a gaming console, an electronic book reader, a personal digital assistant (PDA), a computer, such as a laptop computer, notebook computer, or tablet, any other electronic device, or any combination thereof. The host device 130 communicates via a memory interface that enables reading from the data storage device 102 and writing to the data storage device 102. For example, the host device 130 may operate in compliance with a Joint Electron Devices Engineering Council (JEDEC) industry specification, such as eMMC specification. As other examples, the host device 130 may operate in compliance with a universal serial bus (USB) or a universal flash storage (UFS) specification. The host device 130 may communicate with the data storage device 102 in accordance with any other suitable communication protocol.

The data storage device 102 includes the non-volatile memory 103 coupled to the controller 120. The data storage device 102 may be configured to be coupled to the host device 130 as embedded memory. As another example, the data storage device 102 may be a memory card. The data storage device 102 may operate in compliance with a JEDEC industry specification. For example, the data storage device 102 may operate in compliance with a JEDEC specification, one or more other specifications, or a combination thereof.

The controller 120 is configured to receive data and instructions from and to send data to the host device 130. The controller 120 is further configured to send data and commands to the non-volatile memory 103 and to receive data from the non-volatile memory 103. For example, the controller 120 is configured to send data and a write command to instruct the non-volatile memory 103 to store the data to a specified address. As another example, the controller 120 is configured to send a read command to read data from a specified address of the non-volatile memory 103.

The non-volatile memory 103 may be included on a memory die that is separate from the controller 120 and coupled to the controller 120 (e.g., via a bus). However, in other implementations, the non-volatile memory 103 and the controller 120 may be included on a common die. The non-volatile memory 103 may include multiple blocks each having multiple pages of storage elements. The example of FIG. 1 depicts that the non-volatile memory 103 includes a memory array 104 that includes a group 150 of storage elements, which may correspond to a block or a page (e.g., a word line) of the non-volatile memory 103. The group 150 of storage elements may include storage elements 151, 152. The storage elements 151, 152 may be associated with bit values, such as "1" and "0," as depicted in the example of FIG. 1. Although FIG. 1 illustrates a single memory array 104, the non-volatile memory 103 may include multiple memory arrays.

The non-volatile memory 103 may further include a latch 160. The latch 160 may be a multi-bit latching circuit that includes a representative latch element 161 and a representative latch element 162. The latch elements 161, 162 may be associated with bit values, such as "1," as depicted in the example of FIG. 1.

The non-volatile memory 103 may further include read circuitry 140 and write circuitry 142 that are configured to enable operations of reading data from storage elements of the memory array 104 and writing data to storage elements of the memory array 104, respectively. The write circuitry 142 may include skipping logic 144. The skipping logic 144 may store a disable flag 146. The non-volatile memory 103 may further include a random number generator (RNG) 170 (or a pseudo-random number generator) and a counter 174. The counter 174 may store a counter value 176.

In the example of FIG. 1, the non-volatile memory 103 has a configuration that causes the non-volatile memory 103 to skip writing of at least one value (i.e., a zero value, a one value, or the zero value and the one value) into a storage element when the storage element already contains the value. To illustrate, the non-volatile memory 103 may receive the write command 182. The write command 182 may instruct the non-volatile memory 103 to write data into the group 150 of storage elements, such as by instructing the non-volatile memory 103 to write a "1" value to the storage element 151. The skipping logic 144 may determine that the storage element 151 already stores a "1" value, as illustrated in the example of FIG. 1. Upon determining that the storage element 151 already stores the "1" value, the skipping logic 144 causes the non-volatile memory 103 to skip writing the "1" to the storage element 151.

Skipping overwriting of data stored at a storage element of the group 150 may reduce reliability of the data storage device 102 in certain cases. For example, if a state of the storage element 151 indicating a "1" state is close to a threshold value separating the "1" state from a "0" state (but still within the range for the "1" state), then the skipping logic 144 may cause the non-volatile memory 103 to skip one or more operations (e.g., a write operation) targeting the storage element 151. Skipping the operation targeting the storage element 151 in this example avoids moving the state of the storage element away from the threshold and may reduce accuracy of stored data and may eventually result in a bit error in the data, such as if the "1" state crosses the threshold value due to a write disturb effect or another event.

A first graph 106 shows a distribution of states of storage elements of the non-volatile memory 103. A horizontal axis 191 corresponds to a storage element state (e.g., a voltage, a resistance, etc.), and a vertical axis 190 corresponds to a number of storage elements having the state. A first lobe 192 illustrates storage elements having states corresponding to a first value (e.g., a "1" value) and a second lobe 193 illustrates storage elements having states corresponding to a second value (e.g., a "0" value). A value stored in a storage element may be determined by comparing the state of the storage element to a threshold value 195. For example, a representative storage element 194 is illustrated as having a state above the threshold value 195, indicating that the storage element 194 stores a "0" value.

One or more processes, illustrated as an arrow 107, may cause the lobes 192 and 193 to shift and/or widen, resulting in lobes 196 and 197, respectively, in a second graph 108. For example, the one or more processes may include increased temperature, writing of data to nearby storage elements, overwriting or re-writing of data to the storage elements, etc. A position of storage element 194 has shifted in the second graph 108 as compared to the first graph 106, indicating that a state of the storage element 194 has drifted from its prior value and has approached the threshold value 195. Upon crossing the threshold value 195, the storage elements 194 would be incorrectly read as storing a "1" value rather than a "0" value.

Writing data into the storage element 194 resets the state of the storage element 194 to a value near the center of the lobe 192 (when a "1" is written into the storage element 194) or the lobe 193 (when a "0" is written into the storage element 194). However, when the non-volatile memory 103 is configured to skip writing of values to storage elements that contain the values, the storage element 194 (storing the "0" value) will be skipped and will not be reset when new data is stored to the non-volatile memory 103 if the new data also corresponds to a "0" value stored into the storage element. As a result, the state of the storage element 194 may drift uncorrected toward, and may eventually cross, the threshold value 195.

By performing a state resetting operation 109, such as the in-place refresh command 180 or the write-all command 184, the storage elements may return to a "fresh" state, such as a distribution illustrated in a third graph 110. A first lobe 198 and a second lobe 199 of the third graph 110 are narrower than the lobes 196-197 of the second graph 108. The lobes 198-199 do not overlap each other and are distanced from the threshold value 195. The storage element 194, while continuing to store a "0" value, has been reset to have a state near the center of the second lobe 199.

During operation, the data storage device 102 may set the disable flag 146 to indicate either a first mode of operation that skips writing values into storage elements or a second mode of operation that writes values into storage elements that already contain the values. In a particular example, a first value of the disable flag 146 (e.g., non-assertion of the disable flag 146) causes the non-volatile memory 103 to operate according to the first mode, and a second value of the disable flag 146 (e.g., assertion of the disable flag 146) causes the non-volatile memory 103 to operate according to the second mode.

To illustrate, the controller 120 may send a command 172 to the non-volatile memory 103. The command 172 may include the write command 182, which may command the non-volatile memory 103 to write data into a particular location in the non-volatile memory 103. The particular location may correspond to the group 150 of storage elements. The write command 172 may include the data and an address corresponding to the particular location, such as a physical address of a block or a page of the non-volatile memory 103. The non-volatile memory 103 is configurable to disable skipping of writing a first data value to a storage element that contains the first data value. For example, the skipping logic 144 may be configurable (e.g., based on the disable flag 146) to disable skipping writing of a first data value to a first storage element that stores the first data value, such as by skipping writing a "1" value to the storage element 151 when the storage element 151 contains the "1" value. Alternatively, or in addition, the skipping logic 144 may be configurable (e.g., based on the disable flag 146) to disable skipping of writing a second data value to a storage element that stores the second data value, such as by skipping writing of a "0" value to the storage element 152 when the storage element 152 contains the "0" value. To further illustrate, writing data in response to the write command 182 may include disabling skipping of writing one or both of the first value and the second value.

In response to the write command 182, the non-volatile memory 103 may determine whether to write the data according to the first mode that skips writing values into storage elements that contain the values or according to the second mode that writes the values into the storage elements that contain the values. In some implementations, the non-volatile memory 103 determines whether to write the data according to the first mode or the second mode based on the counter value 176 indicated by the counter 174. The counter value 176 may indicate a number of write operations that have been performed at the particular location using the first mode since a most recent write operation was performed at the particular location using the second mode. If the counter value 176 satisfies (e.g., equals or exceeds) a threshold value, the non-volatile memory 103 may write the data into the particular location according to the second mode. If the counter value 176 fails to satisfy the threshold value, the non-volatile memory 103 may write the data into the particular location according to the first mode.

In one or more other implementations, determining whether to write the data according to the first mode or according to the second mode is based on a probabilistic condition being satisfied. To illustrate, the RNG 170 may randomly (or pseudo-randomly) generate a value, such as a randomly generated value 178. In this example, if the randomly generated value 178 satisfies a threshold value, the probabilistic condition is satisfied, and the non-volatile memory may write the data into the particular location according to the second mode. If the randomly generated value 178 fails to satisfy the threshold value, the probabilistic condition is not satisfied, and the non-volatile memory may write the data into the particular location according to the first mode.

The techniques of FIG. 1 enable improved performance of a data storage device by writing data according to the first mode or the second mode. To illustrate, upon programming, a state associated with a storage element (e.g., a set state) may be centered (or approximately centered) in a target state distribution. Over time, disturb effects caused by external disturbances (e.g., writing to neighboring storage elements) or by internal conditions (e.g., temperature change in the storage element) may cause the state to "drift" toward a boundary associated with another state (e.g., a reset state). By periodically or occasionally writing data according to the second mode (e.g., a refresh operation), disturb effects can be mitigated, thus reducing data errors caused by disturb events.

FIG. 1 further depicts that the data storage device 102 may utilize an in-place refresh command 180 that is distinct from the write command 182 and that causes the non-volatile memory 103 to perform a direct refresh operation. For example, the controller 120 may send the in-place refresh command 180 to the non-volatile memory 103 to refresh data at a particular location in the non-volatile memory 103. In response to the in-place refresh command 180, the non-volatile memory 103 re-writes the data into the particular location to refresh the data at the particular location. The particular location may correspond to the group 150 of storage elements. The particular location may correspond to a page of the non-volatile memory 103 or a block of the non-volatile memory 103, as illustrative examples.

Re-writing the data into the particular location may include reading the data from the particular location to the latch 160 and writing the data from the latch 160 in response to receiving the in-place refresh command 180. For example, data stored at the group 150 of storage elements may be read into the latch 160 and written "in-place" back to the group 150 of storage elements. In a particular example, the group 150 of storage elements corresponds to a block of the non-volatile memory 103, and the non-volatile memory 103 performs a "page-by-page" refresh of data stored at the block. For example, the non-volatile memory 103 may sequentially refresh data stored in each page of the block by writing data from a page into the latch 160 and then writing the data from the latch 160 to the page.

As used herein, a refresh operation is distinct from a write operation initiated by the controller 120 to write data, such as a write operation to write data at the non-volatile memory 103 initiated using a write command 182. The in-place refresh command 180 may exclude the data to be refreshed (since the data to be refreshed is stored at the particular location of the non-volatile memory 103, in this example). The in-place refresh command 180 is distinct from an "out-of-place" refresh command that refreshes data at a particular location by re-writing the data to another location.

The in-place refresh command 180 of FIG. 1 enables in-place refresh of data as compared to non-volatile memories that either do not support in-place refresh operations (e.g., by requiring erasure of a block before writing data to the block or by performing out-of-place refresh operations) or that perform in-place refresh operations using multiple commands (e.g., a read command and a write command). Accordingly, the data storage device 102 may simplify refresh operations by using a single command, such as the in-place refresh command 180, to cause the non-volatile memory 103 to perform an in-place refresh operation.

Alternatively, or in addition, the in-place refresh command 180 may enable in-place refresh of data stored at a non-volatile memory that is configured to skip writing of a value into a storage element when the storage element contains the value. For example, certain devices are configured to skip performing a "set" operation on a storage element that has a "set" state. Alternatively, or in addition, a device may be configured to skip performing a "reset" operation on a storage element that has a "reset" state. In such devices, states of storage elements may drift or degrade over time, such as after maintaining a particular data value for a certain time duration after programming. The in-place refresh command 180 enables in-place refresh of data to refresh such data values to reduce or avoid state degradation by preventing skipping (e.g., via setting a value of the disable flag 146).

FIG. 1 further depicts that the controller 120 may be configured to send a write-all command 184 to the non-volatile memory 103. The write-all command 184 may command the non-volatile memory 103 to write data at a particular location in the non-volatile memory 103, such as at a block or a page of the non-volatile memory 103. In response to the write-all command 184, the non-volatile memory 103 may write the data into storage elements of the particular location without skipping writing of any of the storage elements of the particular location. The particular location may correspond to the group 150 of storage elements.

The write-all command 184 enables the controller 120 to cause the non-volatile memory 103 to write data values into storage elements without skipping writing of any of the storage elements by disabling the skipping logic 144 (e.g., via the disable flag 146). By using the write-all command 182 to write data at the non-volatile memory 103, disturb effects can be mitigated, thus reducing data errors caused by the disturb effects.

Figure 2:
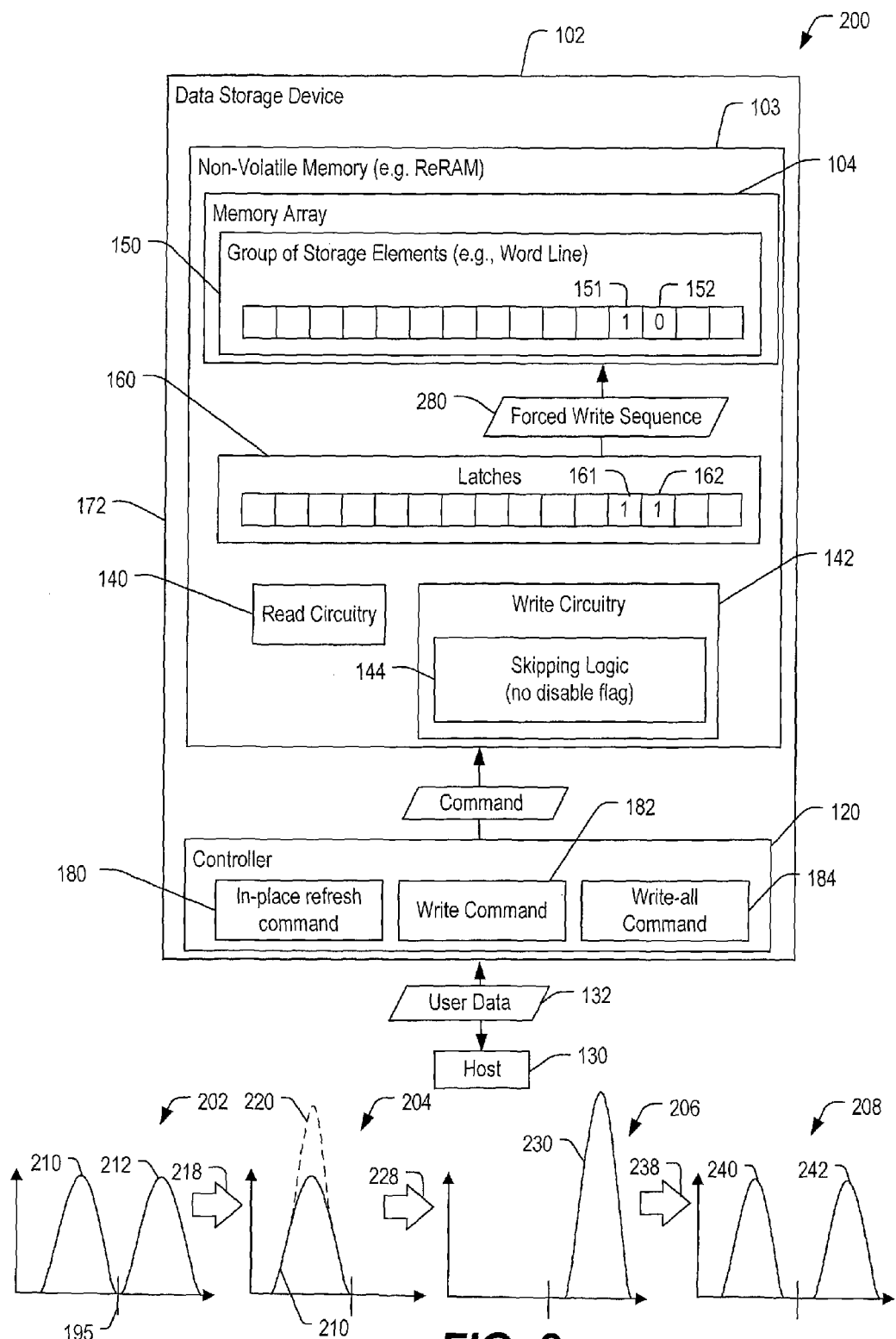
FIG. 2 is a block diagram of another particular illustrative embodiment of a system including a data storage device.

FIG. 2 depicts a particular embodiment of a system 200. Certain components and operations of the system 200 may be as described with reference to the system 100 of FIG. 1. For example, the system 200 may include the data storage device 102 and the host device 130. In a particular example, the system 200 corresponds to an implementation in which the skipping logic 144 of the non-volatile memory 103 is not configured to be disabled. For example, in the system 200, the skipping logic 144 does not store (or respond to) a disable flag, as depicted in FIG. 2.

Instead of disabling the skipping logic 144, the write circuitry 142 may be configured to bring the storage elements of a particular location (e.g., the group 150) to a common value prior to writing data to the storage elements. For example, the write circuitry 142 and/or the latch 160 may be configured to send a forced write sequence 280 of data values. To illustrate, the non-volatile memory 103 may receive the in-place refresh command 180, the write command 182, or the write-all command 184. The in-place refresh command 180, the write command 182, or the write-all command 184 may indicate a particular location of the non-volatile memory 103 at which data is to be re-written or written. Writing the data may include sending the forced write sequence 280 of data values as a first set of all-1 values followed by a second set of all-0 values to be written to the particular location prior to sending the data. For example, writing the data may include sending the forced write sequence 280 of data values to the group 150 of storage elements.

In another embodiment, the skipping logic 144 has a configuration that supports disabling of skipping of one data value (e.g., a first data value, such as one of a "0" value or a "1" value) but not another value (e.g., a second data value, such as the other of the "0" value or the "1" value). The non-volatile memory 103 is configurable to disable skipping of writing a first data value to a storage element that contains the first data value, and the forced write sequence 280 may be used to reset storage elements to the first data value prior to storing data into the storage elements. The forced write sequence 280 includes first write data to write the first data value (e.g., a "0" value or a "1" value) to the storage elements of a particular location prior to writing the data to the storage elements of the particular location.

In an embodiment where the skipping logic 144 does not support disabling skipping of writing the first data value and does not support disabling skipping of writing the second data value, writing data may include bringing the storage elements to a first common value (e.g., one of a "0" value or a "1" value) and bringing the storage elements to a second common value (e.g., the other of the "0" value or the "1" value) prior to writing the data. The forced write sequence 280 may include first write data to write a first data value (e.g., one of a "0" value or a "1" value) to the storage elements of the particular location and further includes second write data to write a second data value (e.g., the other of the "0" value or the "1" value) to the storage elements after writing the first data value. The first write data and the second write data may be written to the storage elements of the particular location so that each of the storage elements is written at least once prior to writing the data to the storage elements of the particular location.

An example of storage elements operated upon by the forced write sequence 280 is depicted in graphs 202-208. The first graph 202 illustrates a distribution of storage elements and has a first lobe 210 and a second lobe 212. The first lobe 210 corresponds to storage elements that have been programmed to store a first data value, described as a "1" value for purposes of the present example. The second lobe 212 corresponds to storage elements that have been programmed to store a second data value, described as a "0" value in the present example. As compared to a "fresh" distribution, such as in the first graph 106 of FIG. 1, each of the lobes 210 and 212 includes storage elements having states close to the threshold value 195. Further drift of storage element states across the threshold value 195 will result in errors due to some storage elements in the first lobe 210 being read as storing a "0" value and/or some storage elements in the second lobe 212 being read as storing a "1" value.

A first write operation 218 of the forced write sequence 280 brings the storage elements to a first common value, illustrated as a "1" value, and a resulting distribution of the storage elements is depicted in the second graph 204. With operation of the skipping logic 144, storage elements in the first lobe 210 store a "1" value and are therefore skipped, leaving the states of storage elements in the first lobe 210 of the first graph 202 substantially unchanged. However, storage elements in the second lobe 212 are reset to store a "1" value and are added to the first lobe 210 as a relatively narrow distribution 220 of freshly programmed storage elements.

A second write operation 228 of the forced write operation 280 brings the storage elements to a second common value, illustrated as a "0" value, and a resulting distribution of the storage elements is depicted in the third graph 206. Because the storage elements are changed from storing the "1" value to storing the "0" value, no storage elements are skipped and all storage elements are set. The resulting distribution has a single lobe 230 that is relatively narrow and distanced from the threshold value 195.

A third write operation 238 programs data to the storage elements by resetting storage elements to store a "1" value and skipping storage elements to store a "0" value. A fourth graph 208 illustrates a resulting distribution including a first lobe 240 and a second lobe 242. As compared to the first graph 202, the distribution of the fourth graph 208 has storage elements farther from the threshold value 195 and therefore is more robust to errors due to drifting of storage element states.

Although the example provided with respect to the graphs 202-208 illustrates bringing the storage elements to a "1" value followed by bringing the storage elements to a "0" value, in other implementations the storage elements may first be brought to the "0" value and then to the "1" value. In implementations where the skipping logic 144 may be partly disabled such that storage elements that already store a "0" value are not skipped when writing a "0" value, the first write operation 218 may be omitted and instead all storage elements may be brought to the "0" value via the second write operation 228 to obtain the distribution of the third graph 206. Alternatively, in implementations where the skipping logic 144 may be partly disabled such that storage elements that already store a "1" value are not skipped when writing a "1" value, the first write operation 218 may result in a "fresh" distribution (e.g., similar in shape to the lobe 230) of storage elements having the "1" value rather than the distribution depicted in the second graph 204, and the second write operation 228 may be omitted.

In conjunction with the embodiments depicted in FIGS. 1-2, a memory controller (e.g., the controller 120) or host computer that executes memory management operations may be provided with a mechanism to perform a refresh operation by issuing a single command. As illustrated, a memory device (e.g., the non-volatile memory 103) can support a new command (a "refresh" command) that includes an address (e.g., an address of a page or of a block in the non-volatile memory 103) which is to be refreshed by the memory device. The refresh command does not include data to be stored, because the data to be stored is read from the storage elements at the address included in the refresh command.

In response to receiving a refresh command, the memory device may read the targeted page or block of data from the storage elements into an internal latch (e.g., the latch 160). After entering the data into the internal latch, the memory device writes the data back into the same storage elements from which the data was read.

Such "refreshing" may be performed by the memory device by reading and re-writing a single chunk of data, or the refreshing may be performed by dividing the data to multiple chunks and refreshing each of the multiple chunks in turn. Refreshing data using multiple chunks of the data may be performed when the available latches in the memory device have insufficient storage capacity to store the data. As an example, an entire block that includes multiple pages of data may be refreshed using page-sized chunks.

The refresh command may be implemented in memory technologies, such as ReRAM, that support over-writing of existing data with new data without having to first erase the existing data. However, some memories may implement write operations in a way that interferes with in-place refreshing.

To illustrate, a sequence of events when executing a write command in such a memory device may include:

a. The memory device receives a write command with the write command specifying an address to be written and the new data chunk to be stored at that address.

b. The memory device internally reads from the specified address in a memory cell array to determine the currently existing data at the targeted memory cells.

c. Logic in the memory device classifies the targeted memory cells into one of: (1) memory cells that are already at their target value; (2) memory cells that are currently at "1" and are to be set to "0"; or (3) memory cells that are currently at "0" and are to be reset to "1".

d. The memory device writes all of the memory cells of the second category (category (2) above) by setting the memory cells of the second category to "0".

e. The memory device writes all of the memory cells of the third category (category (3) above) by resetting the memory cells of the second category to "1".

In this example, memory cells that are read as already being in their new target value (category (1) above) are not affected (or "touched") by the write command (i.e., are "skipped"), including when the write command is part of a refresh operation. However, not touching memory cells that store their target value reduces effectiveness of the refreshing operation. To illustrate, memory cells that have accumulated a large disturbance that causes the state of the memory cells to be very close to, but not cross, a threshold value separating the memory cell states (i.e., a marginal state) would not be affected by the refresh write operation and would remain in a marginal state.

Refreshing of storage elements that are near a state threshold but that have not yet changed state may be performed using the techniques described with respect to the write circuitry 142 and the non-volatile memory 103 of FIGS. 1-2. As a result, a memory controller or host computer that applies memory management operations may be provided with a mechanism to force the memory device to refresh existing data without skipping memory cells. The controller or the host can cause the memory device to actively refresh the data into each of the potentially affected memory cells, regardless of the previous states of the memory cells. Memory cells that are refreshed, including memory cells having marginal states, are brought to "fresh" states that are relatively far from state boundaries and that may be substantially centered between a pair of state boundaries that define a memory cell state.

A memory device can support a "refresh all" command that forces a complete refreshing of the targeted page or block, as explained above. The refresh all command may be similar to the refresh command. However, the refresh all command causes every targeted memory cell to be refreshed to a "fresh" state that may be free of prior state disturbances. The refresh all command may be supported by the memory device in addition to the refresh command, enabling a controller or a host to determine whether to use the refresh command or the refresh all command on a case-by-case basis. As an alternative, the memory device may support the refresh all command without also supporting a refresh command.

In some implementations, executing a set operation on a memory cell that is already in a set state or executing a reset operation on a memory cell that is already in a reset state might damage the memory cell. In such memories, rather than disabling skipping (e.g., using the disable flag 146 of FIG. 1), the refresh all command may result in a sequence of actions including a forced write sequence (e.g., the forced write sequence 280 of FIG. 2). Various implementations of memory devices may include:

A. Memory devices that do not allow memory cells in state "0" to be written again to "0", but do allow cells in state "1" to be written again to "1". In such cases, the refresh all command may be implemented in a memory device by:

a) reading data of the page to be refreshed and keeping the data in an internal latch (e.g., a multi-bit latch internal to the memory device and configured to latch a sufficient number of bits to store the page to be refreshed, such as the latch 160), b) writing all memory cells targeted by the refresh all command to "1" with skipping disabled, and c) writing the data from the latch to the page. Skipping may be enabled during writing of the data from the latch to the memory cells because memory cells containing a "0" value are reset to "1" in (b) above and are not in marginal states after being written now to "0" value.

B. Memory devices that do not allow memory cells in state "1" to be written again to "1", but do allow memory cells in state "0" to be written again to "0". In such cases, the refresh all command may be implemented in the memory device by:

a) reading data from the page to be refreshed and keeping the data in an internal latch, b) writing each of the memory cells targeted by the refresh all command to "0" with skipping disabled, and c) writing the data from the latch to the page. Skipping may be enabled during writing of the data from the latch to the memory cells because memory cells containing a "1" value are reset to "0" in (b) above and are not in marginal states after being written now to "1" value.

C. Memory devices that do not allow cells in state "0" to be written again to "0" and that also do not allow cells in state "1" to be written again to state "1". In such cases, the refresh all command may be implemented in the memory device by:

a) reading data from the page to be refreshed and keeping the data in an internal latch, b) writing memory cells targeted by the refresh all command to "0" with skipping enabled, c) writing memory cells targeted by the refresh all command to "1" with skipping enabled (note that the order of (b) and (c) may be reversed), and d) writing the data from the latch to the page with skipping enabled.

In some implementations, in addition to or instead of the refresh all command, a memory device may provide additional functionality, such as:

1. Provide a mechanism for a memory management system to write new data into a page such that marginal cells are "cured" and no cell remains marginal after the operation. Such a "curing" write operation may be slower than a regular (non-curing) write operation.

2. Implement a policy in a memory management system of the memory device that causes each page to be written using the above curing write operation once in a while, so that cells in a page do not accumulate disturbances and drift without limit, but instead are reset to a non-marginal state with sufficient frequency to reduce an occurrence of errors.

As an example, the memory management system may verify, for each page, that on average every Nth write operation uses a curing write operation, while other write operations use a regular (non-curing) write operation. Because the memory device may be able to correct up to a particular number of bit errors, N may be selected to be small enough so that a page has a low probability (e.g., below a threshold probability) of accumulating beyond an 'acceptable' amount of bit errors. The acceptable amount of bit errors may be set at a value less than or equal to the correction capability of the memory device.

To illustrate, a memory management system may keep a counter (e.g., the counter 174) per page for counting the number of regular write operations to the corresponding page since the last curing write operation. Alternatively, the memory management system may keep a counter per block for counting the number of regular write operations performed at the corresponding block since the last curing write operation was performed at the block. Each page of the block may be cured in response to the count equaling or exceeding N times the number of pages in the block.

As another example of implementing curing write operations every Nth write operation on average, the memory management system may select, for each write operation, whether to perform a curing write operation or a regular write operation. A curing write operation may be selected with a probability of 1/N (e.g., by comparing a randomly generated value 178 to a threshold), while a regular write operation may be selected with a probability of (N−1)/N. Because the memory device may be able to correct up to a particular number of bit errors, N may be selected to be small enough so that a page has a low probability (e.g., below a threshold probability) of accumulating beyond an 'acceptable' amount of bit errors. The acceptable amount of bit errors may be set at a value less than or equal to the correction capability of the memory device.

In some embodiments, the memory device supports a "write-all" command that includes an address of a targeted page and data to be stored in the targeted page. In response to receiving the write-all command, the memory device overwrites the data stored in the targeted page with the data included in the "write-all" command. The write-all command is similar to a regular write command but does not skip any of the cells, regardless of whether the new value to be stored into a cell is the same as the previous value stored in the cell.

The write-all command may be implemented by disabling cell skipping (e.g., via the disable flag 146). However, some memories may require use of a skipping mechanism because executing a set operation on a cell that is already in a set state or executing a reset operation on a cell that is already in a reset state might damage the cell. In such memories, various alternative implementations may include:

1. In memories that do not allow cells in state "0" to be written again to "0", but that do allow cells in state "1" to be written again to "1", the write-all command may be implemented by writing all cells of the target page to "1" with skipping disabled, and writing the new data provided in the write-all command to the target page. Skipping may be enabled when writing the new data to the target page.

2. In memories that do not allow cells in state "1" to be written again to "1", but that do allow cells in state "0" to be written again to "0", the write-all command may be implemented by writing all cells of the target page to "0" with skipping disabled, and writing the new data provided in the write-all command to the target page. Skipping may be enabled when writing the new data to the target page.

3. In memories that do not allow cells in state "0" to be written again to "0" and that also do not allow cells in state "1" to be written again to state "1", the write-all command may be implemented by:

a) writing all cells of the target page to "1",
b) writing all cells of the target page to "0", and
c) writing the new data provided with the write-all command to the target page. Skipping may be enabled for any of (a), (b), and (c). The order of (a) and (b) may be reversed.

In an embodiment in which a memory device does not support a write-all command, a memory controller or a host running memory management operations may emulate a write-all command by sending a command to the memory device to write the target page to all-zeroes, sending a command to the memory device to write the target page to all-ones, and sending a command to the memory device to write the target page with the new data. As an alternative, the command to write all-ones may be sent prior to sending the command to write all-zeros.

Figure 3:
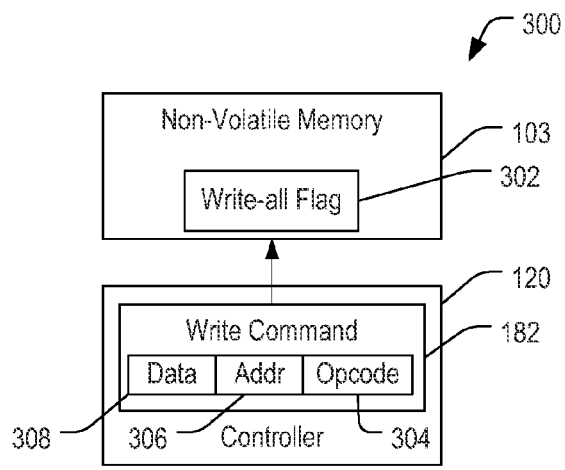
FIG. 3 is a block diagram of a particular embodiment of a data storage device configured to execute the write-all command of FIG. 1 based on a write-all flag.

Referring to FIG. 3, an embodiment of the data storage device 102 of FIG. 1 or FIG. 2 is illustrated in which an opcode of the write-all command 184 matches an opcode 304 of the write command 182 and a flag 302 in the non-volatile memory 103 distinguishes the write-all command 184 from the write command 182. For example, the write command 182 may include the opcode 304, an address portion 306, and a data portion 308. The opcode 304 may identify the write command 182 to the non-volatile memory 103, such as by use of a set or series of bits that are recognized by the non-volatile memory 103 as indicating a write instruction.

Instead of the controller 120 including a write-all command 184 having a distinct opcode, the flag 302 in the non-volatile memory 103 may be checked when a write command is received to determine whether the write command corresponds to the write-all command. For example, the flag 302 having a first value (e.g., "1") may indicate that a received write command is to be executed as the write command 182 of FIG. 1, and the flag 302 having another value (e.g., "0") may indicate that the received write command is to be executed as the write-all command 184 of FIG. 1. The controller 120 may include one or more instructions to set or adjust the value of the flag 302. Alternatively, or in addition, the non-volatile memory 103 may be configured to set or adjust the value of the flag 302.

Figure 4:
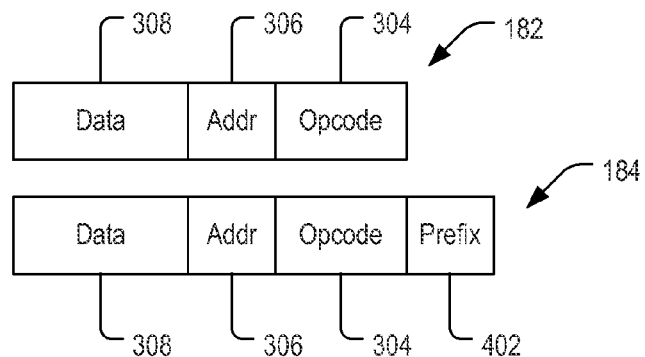
FIG. 4 is a block diagram of a particular embodiment of the write command and the write-all command of FIG. 1.

Referring to FIG. 4, another implementation of the write command 182 and the write-all command 184 of FIG. 1 is depicted. The write command 182 may include the opcode 304, the address portion 306, and the data portion 308 as depicted in FIG. 3. The write-all command 184 may also include the opcode 304, the address portion 306, and the data portion 308. In addition, the write-all command 184 includes a prefix 402, such as one or more bits that, when received preceding the opcode 304, are recognized by the non-volatile memory 103 as indicating a write-all command. To illustrate, the non-volatile memory 103 may be configured to identify the write-all command 184 of FIG. 1 in response to receiving the prefix 402 preceding the write command 182 of FIG. 1.

Figure 5:
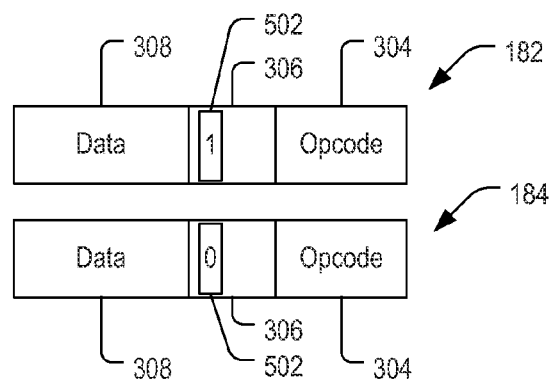
FIG. 5 is a block diagram of another particular embodiment of the write command and the write-all command of FIG. 1.

Referring to FIG. 5, another implementation of the write command 182 and the write-all command 184 of FIG. 1 is depicted. The write command 182 may include the opcode 304, the address portion 306, and the data portion 308 as depicted in FIG. 3. The write-all command 184 may also include the opcode 304, the address portion 306, and the data portion 308. The opcode 304 of the write command 182 matches the opcode 304 of the write-all command 184. However, the write-all command 184 includes a flag 502 that is received following the opcode 304 and that has a value that distinguishes the write-all command 184 from the write command 182. As illustrated, the flag 502 having a first value (e.g., a "1") may identify the command as the write command 182, while the flag 502 having a second value different from the first value (e.g., a "0") may identify the command as the write-all command 184. In some implementations, the flag 502 may be included as a bit in the address portion 306 that is not used as part of an address.

Although FIGS. 3-5 illustrate the opcode 304, the address portion 306, and the data portion 308, in other implementations the write command 182, the write-all command 184, or both, may not include one or more of the opcode 304, the address portion 306, or the data portion 308. As an example, a command to write to a next sequential address following a prior write command may omit the address portion 306. In addition or alternatively, the write command 182, the write-all command 184, or both, may include one or more portions other than the opcode 304, the address portion 306, and the data portion 308, such as a checksum bit, a dedicated flags portion, and/or a terminator portion, as illustrative, non-limiting examples.

Figure 6:
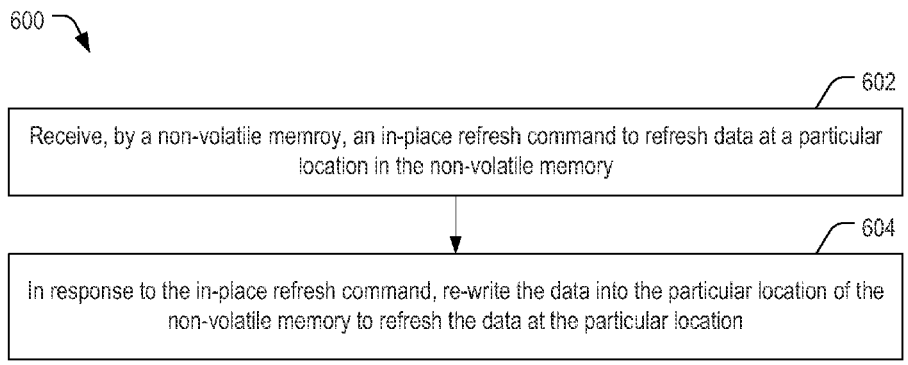
FIG. 6 is a flow chart that illustrates a particular embodiment of a method that may be performed by a data storage device, such as one or both of the data storage device of FIG. 1 or the data storage device of FIG. 2.

Referring to FIG. 6, a particular embodiment of a method 600 that may be performed at a data storage device is depicted. For example, the method 600 may be performed by a non-volatile memory. The data storage device may include or correspond to the data storage device 102 of FIG. 1. The data storage device may include a non-volatile memory, such as the non-volatile memory 103 of FIG. 1. In some implementations, the non-volatile memory may include a three-dimensional array of storage elements, such as described with reference to FIG. 12 and FIG. 13.

The method 600 may include receiving, by the non-volatile memory, an in-place refresh command to refresh data at a particular location in the non-volatile memory, at

602. The in-place refresh command may correspond to the in-place refresh command 180, and the non-volatile memory may correspond to the non-volatile memory 103. The particular location may correspond to the group 150 of storage elements, which may correspond to a block of the non-volatile memory 103 or a page of the non-volatile memory 103, as illustrative examples.

The method 600 may further include re-writing the data into the particular location of the non-volatile memory to refresh the data at the particular location in response to the in-place refresh command, at 604. In a particular example, the particular location corresponds to a block of the non-volatile memory 103, and re-writing the data includes performing a page-by-page refresh of data in the block.

The method 600 enables simplified refresh of data at a non-volatile memory. For example, an in-place refresh of data may be simplified as compared to an out-of-place refresh of data, which may include updating a logical-to-physical mapping table. Further, the method 600 enables an in-place refresh of data using a single command, such as the in-place refresh command 180, which may simplify the in-place refresh as compared to using multiple commands (e.g., read and write commands).

Figure 7:
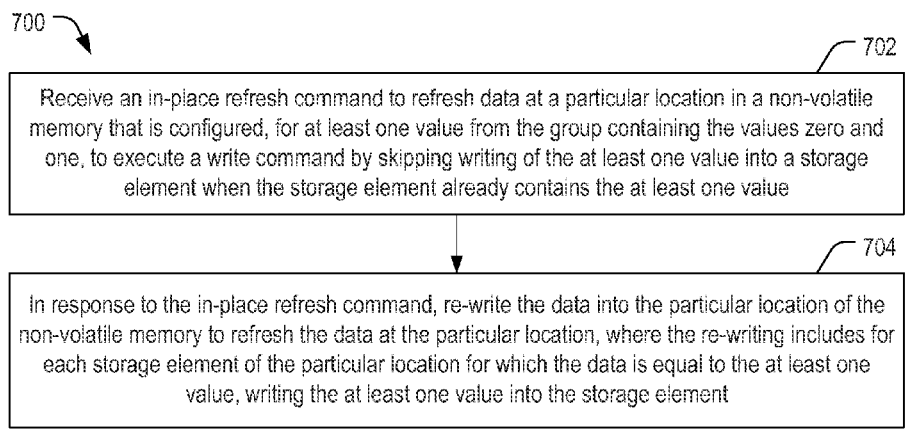
FIG. 7 is a flow chart that illustrates another particular embodiment of a method that may be performed by a data storage device, such as one or both of the data storage device of FIG. 1 or the data storage device of FIG. 2.

Referring to FIG. 7, a particular embodiment of a method 700 that may be performed at a data storage device is depicted. The data storage device may include or correspond to the data storage device 102 of FIG. 1. The data storage device may include a non-volatile memory that is configured, for at least one value from the group containing the values zero and one, to execute a write command by skipping writing of the at least one value into a storage element when the storage element already contains the at least one value, such as the non-volatile memory 103 of FIG. 1 or FIG. 2. In some implementations, the non-volatile memory may include a three-dimensional array of storage elements, such as described with reference to FIG. 12 and FIG. 13.

The method 700 may include receiving, by the non-volatile memory, an in-place refresh command to refresh data at a particular location in the non-volatile memory, at 702. The in-place refresh command may correspond to the in-place refresh command 180, and the non-volatile memory may correspond to the non-volatile memory 103. The particular location may correspond to the group 150 of storage elements, which may correspond to a block of the non-volatile memory 103 or a page of the non-volatile memory 103, as illustrative examples.

The method 700 may further include in response to the in-place refresh command, re-writing the data into the particular location of the non-volatile memory to refresh the data at the particular location, where the re-writing includes, for each storage element of the particular location for which the data is equal to the at least one value, writing the at least one value into the storage element, at 704. For example, re-writing the data may include bringing the storage elements of the particular location to a common value prior to writing the data to the storage elements of the particular location. To illustrate, when the non-volatile memory 103 is configurable to disable skipping of writing at least one value (e.g., a "0" value), the storage elements may be brought to a "0" value with skipping of writing the at least one value disabled.

The method 700 enables in-place refresh of data stored at a non-volatile memory that is configured to skip writing of a value into a storage element when the storage element contains the value. For example, certain devices are configured to skip performing a "set" operation on a storage element that has a "set" state. Alternatively, or in addition, a device may be configured to skip performing a "reset" operation on a storage element that has a "reset" state. In such devices, states of storage elements may drift or degrade over time, such as after maintaining a particular data value for a certain time duration after programming. The method 700 enables in-place refresh of data to refresh such data values to reduce state degradation.

Figure 8:
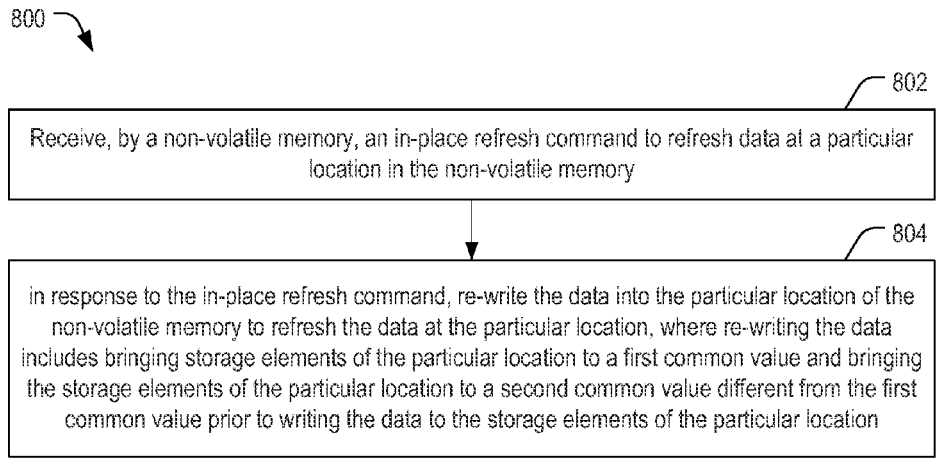
FIG. 8 is a flow chart that illustrates another particular embodiment of a method that may be performed by a data storage device, such as one or both of the data storage device of FIG. 1 or the data storage device of FIG. 2.

Referring to FIG. 8, a particular embodiment of a method 800 that may be performed at a memory device is depicted. For example, the method 800 may be performed by a non-volatile memory. The memory device may include or correspond to the data storage device 102 of FIG. 2. The memory device may include the non-volatile memory, such as the non-volatile memory 103 of FIG. 2. In some implementations, the non-volatile memory may include a three-dimensional array of storage elements, such as described with reference to FIG. 12 and FIG. 13.

The method 800 includes receiving, by the non-volatile memory, an in-place refresh command to refresh data at a particular location in the non-volatile memory, at 802. The in-place refresh command may correspond to the in-place refresh command 180, and the non-volatile memory may correspond to the non-volatile memory 103. The particular location may correspond to the group 150 of storage elements, which may correspond to a block of the non-volatile memory 103 or a page of the non-volatile memory 103, as illustrative examples.

The method 800 further includes, in response to the in-place refresh command, re-writing the data into the particular location of the non-volatile memory to refresh the data at the particular location, at 804. Re-writing the data includes bringing storage elements of the particular location to a first common value and bringing the storage elements of the particular location to a second common value different from the first common value prior to writing the data to the storage elements of the particular location. For example, the forced write sequence 280 of FIG. 2 may be used to write, with skipping, a "0" value to the storage elements of the particular location, and next to write a "1" value to the storage elements. Because the storage elements store the "0" value prior to writing the "1" value, no storage elements are skipped when writing the "1" value. After writing the "1" value, the data may be written to the storage elements. Storage elements that correspond to a "0" value in the data are written, while storage elements that correspond to a "1" value in the data may be skipped.

Figure 9:
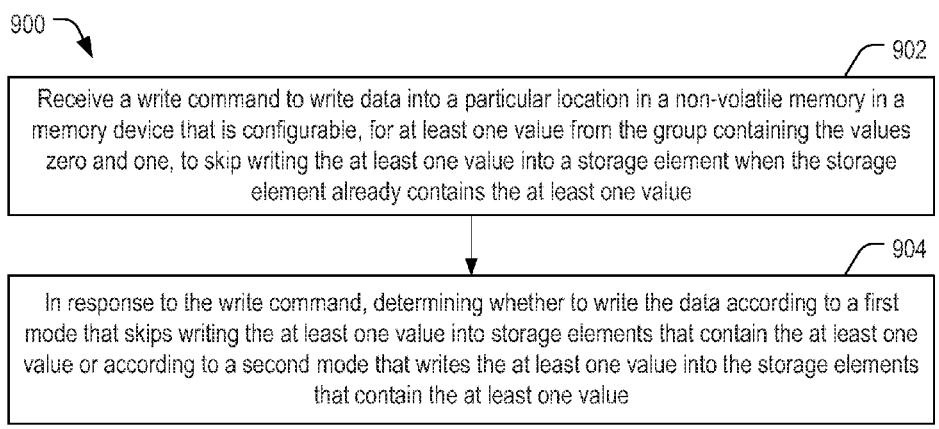
FIG. 9 is a flow chart that illustrates another particular embodiment of a method that may be performed by a data storage device, such as one or both of the data storage device of FIG. 1 or the data storage device of FIG. 2.

Referring to FIG. 9, a particular embodiment of a method 900 that may be performed at a memory device is depicted. For example, the memory device may include or correspond to the data storage device 102 of FIG. 1 or FIG. 2. In some implementations, the non-volatile memory may include a three-dimensional array of storage elements, such as described with reference to FIG. 12 and FIG. 13.

The method 900 may include receiving a write command to write data at a particular location in a non-volatile memory, at 902. The memory device may be configurable, for at least one value from the group containing the values zero and one, to skip writing the at least one value into a storage element when the storage element already contains the at least one value. The write command may correspond to the write command 182, and the non-volatile memory may correspond to the non-volatile memory 103. The particular location may correspond to the group 150 of storage elements, which may correspond to a block of the non-volatile memory 103 or a page of the non-volatile memory 103, as illustrative examples.

The method 900 may further include, in response to the write command, determining whether to write the data according to a first mode that skips writing the at least one value into storage elements that contain the at least one value or according to a second mode that writes the at least one value into the storage elements that contain the at least one value, at 904. For example, determining whether to write the data according to the first mode or according to the second mode may be based on the counter value 176 of the counter 174. As another example, determining whether to write the data according to the first mode or according to the second mode may be based on a probabilistic decision, such as whether a value that is randomly generated by the RNG 170 satisfies a threshold value.

In some implementations, the method 900 may be performed at a controller of a data storage device, such as the controller 120 of FIG. 1 or FIG. 2. For example, the controller 120 may receive a command from the host device 130 to write data to the non-volatile memory 103, and the controller 120 may determine whether to write the data according to the first mode or according to the second mode by accessing the value 176 of the counter 174, and/or a value randomly generated by the RNG 170, from the non-volatile memory 103. Alternatively, the controller 120 may include the random number generator 170 and/or the counter 174. In other implementations, the method 900 may be performed at the non-volatile memory 103 of FIG. 1 or FIG. 2. For example, the non-volatile memory 103 may receive a command from the controller 120 to write the data to the group of storage elements 150 and may decide whether to write the data according to the first mode or according to the second mode based on a value of the RNG 170 and/or of the counter 174 as described above.

The method 900 enables improved reliability of a data storage device by writing data according to the first mode or the second mode. To illustrate, upon programming, a state associated with a storage element (e.g., a set state) may be centered (or approximately centered) in a target state distribution. Over time, disturb effects caused by external disturbances (e.g., writing to neighboring storage elements) or by internal processes (e.g., drift due to temperature change) may cause the state to "drift" toward a boundary associated with another state (e.g., a reset state). By periodically or occasionally writing data according to the second mode, the disturb effects can be mitigated, thus reducing data errors caused by disturb events.

Figure 10:
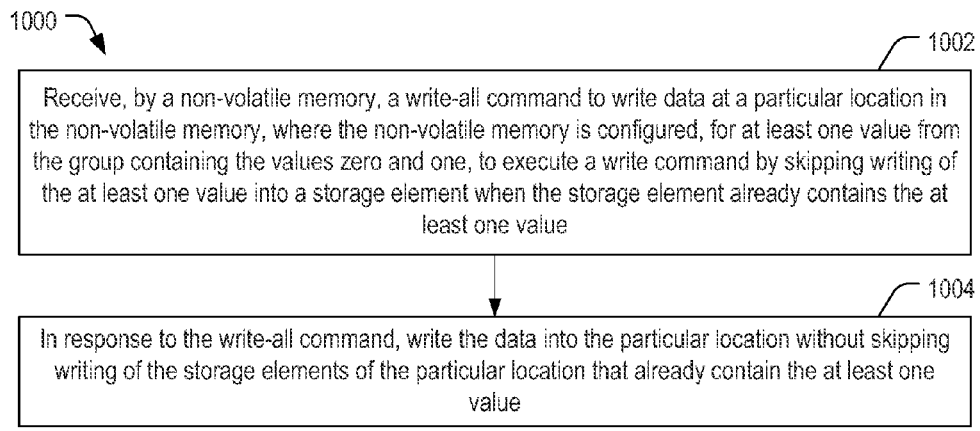
FIG. 10 is a flow chart that illustrates another particular embodiment of a method that may be performed by a data storage device, such as one or both of the data storage device of FIG. 1 or the data storage device of FIG. 2.

Referring to FIG. 10, a particular embodiment of a method 1000 that may be performed at a data storage device is depicted. The data storage device may include or correspond to the data storage device 102 of FIG. 1. The data storage device may include a non-volatile memory, such as the non-volatile memory 103 of FIG. 1. In some implementations, the non-volatile memory may include a three-dimensional array of storage elements, such as described with reference to FIG. 12 and FIG. 13.

The method 1000 may include receiving, by the non-volatile memory, a write-all command to write data at a particular location in the non-volatile memory, at 1002. The non-volatile memory may be configured, for at least one value from the group containing the values zero and one, to execute a write command by skipping writing of the at least one value into a storage element when the storage element already contains the at least one value. The write-all command may correspond to the write-all command 184, and the non-volatile memory may correspond to the non-volatile memory 103. The particular location may correspond to the group 150 of storage elements, which may correspond to a block of the non-volatile memory 103 or a page of the non-volatile memory 103, as illustrative examples.

The method 1000 may further include, in response to the write-all command, writing the data into storage elements of the particular location without skipping writing of any of the storage elements of the particular location that already contain the at least one value, at 1004. To illustrate, if the non-volatile memory 103 is configured, upon receiving the write command 182, to skip writing a data value to a storage element that stores the data value, the controller 120 may use the write-all command 184 to "force" the non-volatile memory 103 to write the data value to the storage element.

Writing the data may include bringing the storage elements of the particular location to a common value prior to writing the data to the storage elements of the particular location. For example, writing the data may include disabling skipping of writing the at least one value, such as disabling skipping of writing a "0" value. With skipping disabled, a "0" may be written to storage elements of the particular location to bring the storage elements to a common value (i.e., the "0" value). After bringing the storage elements to the common value, the data may be written into the storage elements. Although described with respect to disabling skipping of writing the "0" value, in other implementations, skipping of writing the "1" value may instead be disabled.

The method 1000 enables the controller 120 to cause the non-volatile memory 103 to write data values into storage elements without skipping writing of the storage elements. By using the write-all command 184 to write data at the non-volatile memory 103, disturb effects can be mitigated, thus reducing data errors caused by disturb events.

Figure 11:
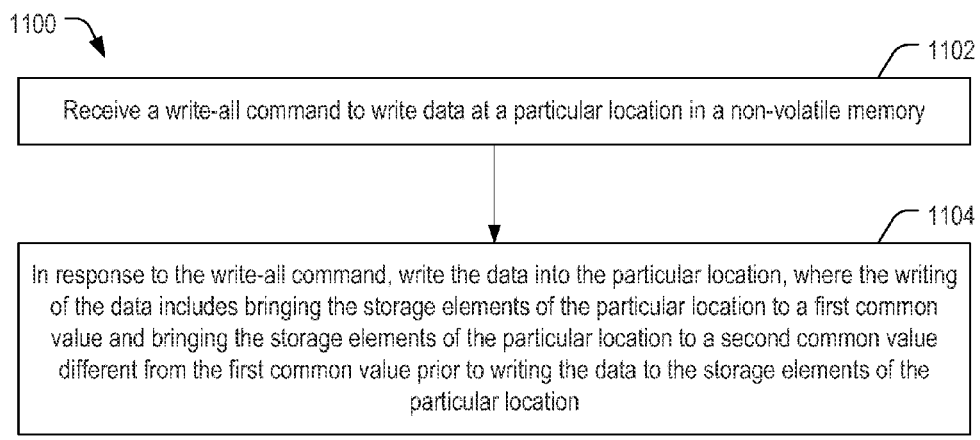
FIG. 11 is a flow chart that illustrates another particular embodiment of a method that may be performed by a data storage device, such as one or both of the data storage device of FIG. 1 or the data storage device of FIG. 2.

Referring to FIG. 11, a particular embodiment of a method 1100 that may be performed at a data storage device is depicted. The data storage device may include or correspond to the data storage device 102 of FIG. 2. The data storage device may include a non-volatile memory, such as the non-volatile memory 103 of FIG. 2. In some implementations, the non-volatile memory may include a three-dimensional array of storage elements, such as described with reference to FIG. 12 and FIG. 13.

A write-all command to write data at a particular location in the non-volatile memory is received, at 1102. For example, the write-all command may include one or more of the implementations described with reference to FIGS. 3-5.

In response to the write-all command, the data is written into the particular location, at 1104. The writing of the data includes bringing the storage elements of the particular location to a first common value and bringing the storage elements of the particular location to a second common value different from the first common value prior to writing the data to the storage elements of the particular location.

Figure 12:
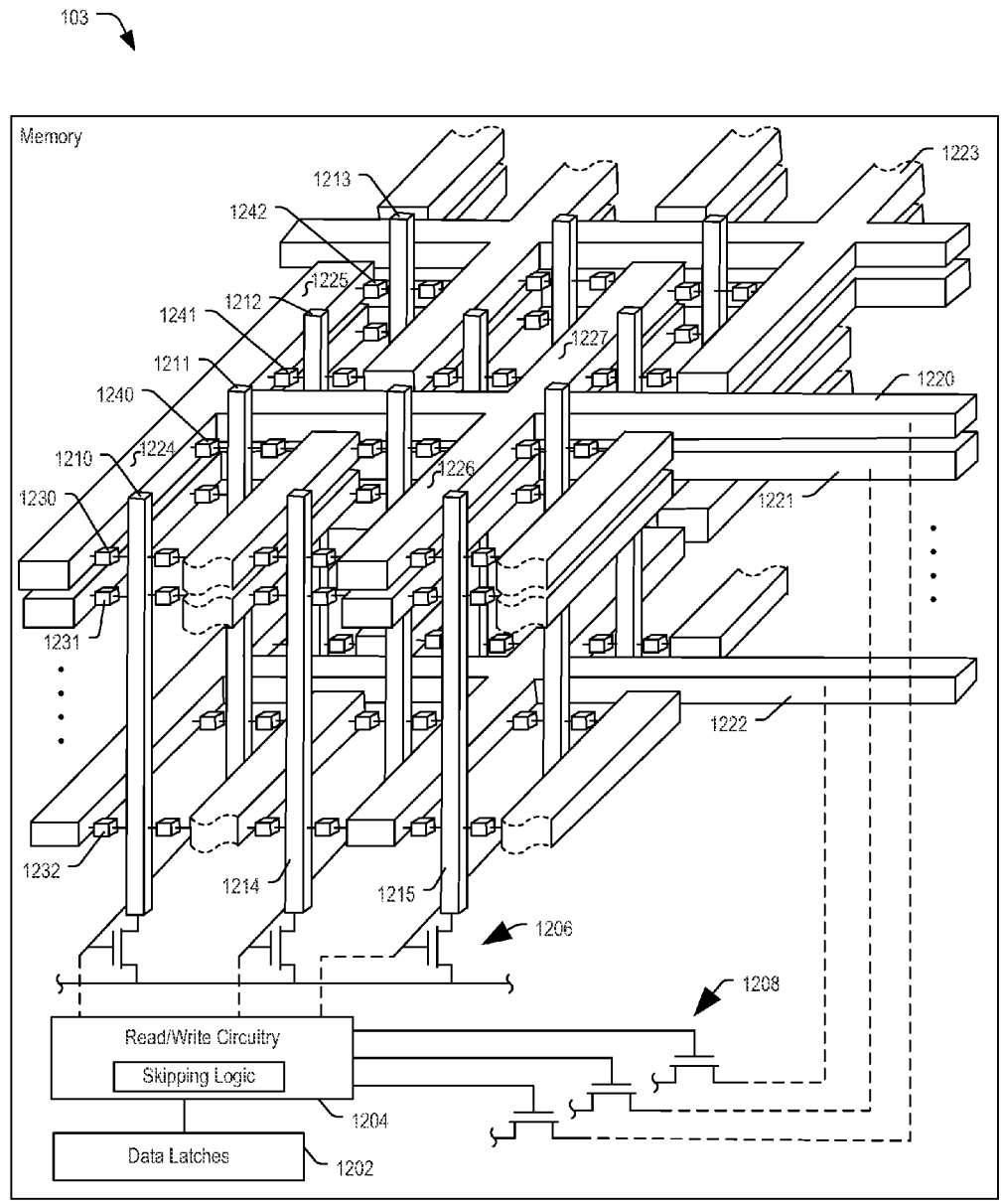
FIG. 12 is a block diagram of a particular embodiment of the non-volatile memory of one or both of the data storage device of FIG. 1 or the data storage device of FIG. 2.

FIG. 12 is a diagram of a particular embodiment of the data storage device 102 of FIG. 1 and/or FIG. 2. FIG. 12 illustrates a portion of a three-dimensional architecture of the memory 103 according to a particular embodiment. In the embodiment illustrated in FIG. 12, the memory 103 is a vertical bit line Resistive Random Access Memory (ReRAM) with a plurality of conductive lines in physical layers over a substrate (e.g., substantially parallel to a surface of the substrate), such as representative wordlines 1220, 1221, 1222, and wordline 1223 (only a portion of which is shown in FIG. 2) and a plurality of vertical conductive lines through the physical layers, such as representative bit lines 1210, 1211, 1212, and 1213. The memory 103 also includes a plurality of resistance-based storage elements (e.g., memory cells), such as representative storage elements 1230, 1231, 1232, 1240, 1241, and 1242, each of which is coupled to a bit line and a wordline in arrays of memory cells in multiple physical layers over the substrate (e.g., a silicon substrate). The memory 103 also includes data latches 1202 and read/write circuitry 1204. The read/write circuitry 1204 is coupled to wordline drivers 1208 and bit line drivers 1206.

In a particular embodiment, the data latches 1202 correspond to the latches 160 of FIG. 1 and/or FIG. 2 and the read/write circuitry 1204 corresponds to the write circuitry 142 of FIG. 1 and/or FIG. 2. The read/write circuitry 1204 includes skipping logic that corresponds to the skipping logic 142 of FIG. 1 and/or FIG. 2.

In the embodiment illustrated in FIG. 12, each of the wordlines includes a plurality of fingers (e.g., a first wordline 1220 includes fingers 1224, 1225, 1226, and 1227). Each finger may be coupled to more than one bit line. To illustrate, a first finger 1224 of the first wordline 1220 is coupled to a first bit line 1210 via a first storage element 1230 at a first end of the first finger 1224 and is coupled to a second bit line 1211 via a second storage element 1240 at a second end of the first finger 1224

In the embodiment illustrated in FIG. 12, each bit line may be coupled to more than one wordline. To illustrate, the first bit line 1210 is coupled to the first wordline 1220 via the first storage element 1230 and is coupled to a third wordline 1222 via a third storage element 1232.

During a write operation, the controller 120 may receive data from a host device, such as the host device 130 of FIG. 1. The controller 120 may send the data (or a representation of the data) to the memory 1200 to be stored in the data latches 1202. For example, the controller 120 may encode the data prior to sending the encoded data to the data latches 1202.

The read/write circuitry 1204 may read data bits from storage elements corresponding to the destination of the data to determine whether to skip writing to any of the storage elements. For example, when the data is to be stored to storage elements coupled to the wordline 1220, the read/write circuitry 1204 may read bit values from the storage elements and latch the read bit values into the data latches 1202 for comparison to the bit values in the data latches 1202 received from the controller 120. When the data value to be written into a particular storage element matches the data value read from the storage element and skipping of the data value is enabled, a flag bit may be set for the particular storage element to a bit value that indicates that writing of the data value to the particular storage element is to be skipped. When the data value to be written into a particular storage element does not match the data value read from the storage element and/or when skipping of the data value to be written into the particular storage element is disabled, a flag bit may be set for the particular storage element to another bit value that indicates that writing of the data value to the particular storage element is not to be skipped. For example, a set of flag bits corresponding to the storage elements of the wordline 1220 may be generated in the data latches 1202 and used as a bit mask for the bit line drivers 1206 to enable or disable writing to individual storage elements during a write operation to the wordline 1220.

The read/write circuitry 1204 may read bits from the data latches 1202 and apply selection signals (e.g., at least partially based on the bit mask) to selection control lines coupled to the wordline drivers 1208 and the bit line drivers 1206 to cause a write voltage to be applied across a selected storage element. For example, to select the first storage element 1230, the read/write circuitry 1204 may activate the wordline drivers 1208 and the bit line drivers 1206 to drive a programming current (also referred to as a write current) through the first storage element 1230. To illustrate, a first write current may be used to write a first logical value (e.g., a value corresponding to a high-resistance state) to the first storage element 1230, and a second write current may be used to write a second logical value (e.g., a value corresponding to a low-resistance state) to the first storage element 1230. The programming current may be applied by generating a programming voltage across the first storage element 1230 by applying a first voltage to the first bit line 1210 and to wordlines other than the first wordline 1220 and applying a second voltage to the first wordline 1220. In a particular embodiment, the first voltage is applied to other bit lines (e.g., the bit lines 1214, 1215) to reduce leakage current in the memory 103.

During a read operation, the controller 120 may receive a request from a host device, such as the host device 130 of FIG. 1. The controller 120 may cause the read/write circuitry 1204 to read bits from particular storage elements of the memory 103 by applying selection signals to selection control lines coupled to the wordline drivers 1208 and the bit line drivers 1206 to cause a read voltage to be applied across a selected storage element. For example, to select the first storage element 1230, the read/write circuitry 1204 may activate the wordline drivers 1208 and the bit line drivers 1206 to apply a first voltage (e.g., 0.7 V) to the first bit line 1210 and to wordlines other than the first wordline 1220. A lower voltage (e.g., 0 V) may be applied to the first wordline 1220. Thus, a read voltage is applied across the first storage element 1230, and a read current corresponding to the read voltage may be detected at a sense amplifier of the read/write circuitry 1204. The read current corresponds (via Ohm's law) to a resistance state of the first storage element 1230, which corresponds to a logical value stored at the first storage element 1230. The logical value read from the first storage element 1230 and other elements read during the read operation may be saved at the data latches 1202 and provided to the controller 120.

Figure 13:
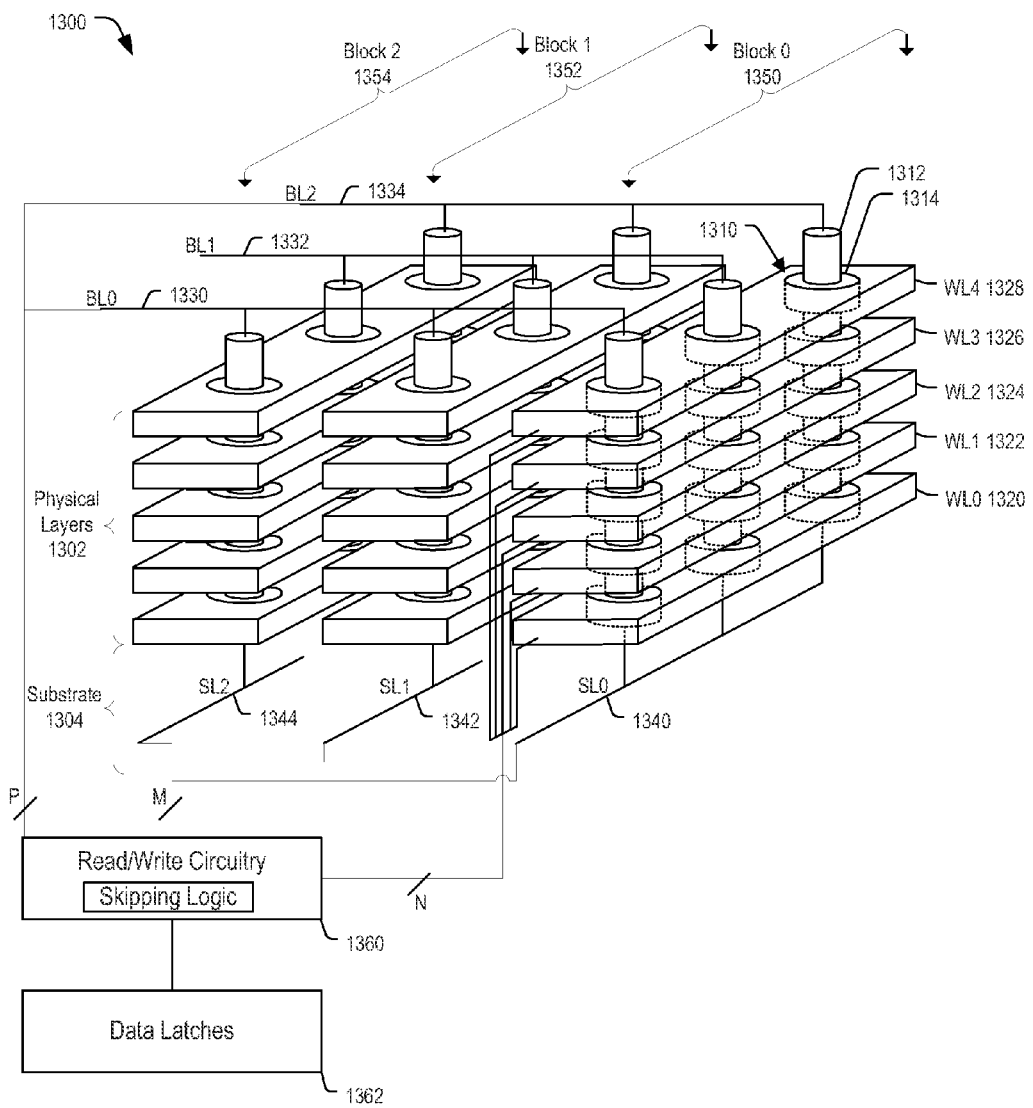
FIG. 13 is a block diagram of another particular embodiment of the non-volatile memory of one or both of the data storage device of FIG. 1 or the data storage device of FIG. 2.

FIG. 13 illustrates an embodiment of a 3D memory 1300 in a NAND flash configuration. The 3D memory 1300 may correspond to the memory 103 of FIG. 1 and/or FIG. 2. The memory 1300 includes multiple physical layers 1302 that are monolithically formed above a substrate 1304, such as a silicon substrate. Storage elements (e.g., memory cells), such as a representative storage element 1310, are arranged in arrays in the physical layers 1302.

The representative memory cell 1310 includes a charge trap structure 1314 between a word line/control gate (WL4) 1328 and a conductive channel 1312. Charge may be injected into or drained from the charge trap structure 1314 via biasing of the conductive channel 1312 relative to the word line 1328. For example, the charge trap structure 1314 may include silicon nitride and may be separated from the word line 1328 and the conductive channel 1312 by a gate dielectric, such as a silicon oxide. An amount of charge in the charge trap structure 1314 affects an amount of current through the conductive channel 1312 during a read operation of the memory cell 1310 and indicates one or more bit values that are stored in the memory cell 1310.

The 3D memory 1300 includes multiple erase blocks, including a first block (block 0) 1350, a second block (block 1) 1352, and a third block (block 2) 1354. Each block 1350-1354 includes a "vertical slice" of the physical layers 1302 that includes a stack of word lines, illustrated as a first word line (WL0) 1320, a second word line (WL1) 1322, a third word line (WL2) 1324, a fourth word line (WL3) 1326, and the fifth word line (WL4) 1328. Multiple conductive channels (having a substantially vertical orientation (i.e., having an up and down orientation in FIG. 13) that are substantially perpendicular to an upper surface of the substrate 1304 extend through the stack of word lines. Each conductive channel is coupled to a storage element in each word line 1320-1328, forming a NAND string of storage elements. FIG. 13 illustrates three blocks 1350-1354, five word lines 1320-1328 in each block, and three conductive channels in each block for clarity of illustration. However, the 3D memory 1300 may have more than three blocks, more than five word lines per block, and more than three conductive channels per block.

Read/write circuitry 1360 is coupled to the conductive channels via multiple conductive lines, illustrated as a first bit line (BL0) 1330, a second bit line (BL1) 1332, and a third bit line (BL2) 1334 at a "top" end of the conducive channels (e.g., farther from the substrate 1304) and a first source line (SL0) 1340, a second source line (SL1) 1342, and a third source line (SL2) 1344) at a "bottom" end of the conductive channels (e.g., nearer to or within the substrate 1304). The read/write circuitry 1360 is illustrated as coupled to the bit lines 1330-1334 via "P" control lines, coupled to the source lines 1340-1344 via "M" control lines, and coupled to the word lines 1320-1328 via "N" control lines. Each of P, M, and N has a positive integer value based on the specific configuration of the 3D memory 1300. In the illustrative example of FIG. 13, P=3, M=3, and N=5.

The read/write circuitry 1360 may operate as described with respect to the write circuitry 142 of FIG. 1 and/or FIG. 2. For example, the read/write circuitry 1360 may read data bits from storage elements corresponding to the destination of the data to determine whether to skip writing to any of the storage elements. To illustrate, when the data is to be stored to storage elements coupled to the wordline 1328, the read/write circuitry 1360 may read bit values from the storage elements and latch the read bit values into data latches 1362 for comparison to the bit values in the data latches 1362 received from the controller 120 of FIG. 1. When the data value to be written into a particular storage element matches the data value read from the storage element and skipping of the data value is enabled, a flag bit may be set for the particular storage element to a bit value that indicates that writing of the data value to the particular storage element is to be skipped. When the data value to be written into a particular storage element does not match the data value read from the storage element and/or when skipping of the data value to be written into the particular storage element is disabled, a flag bit may be set for the particular storage element to another bit value that indicates that writing of the data value to the particular storage element is not to be skipped. For example, a set of flag bits corresponding to the storage elements of the wordline 1328 may be generated in the data latches 1362 and used as a bit mask to enable or disable writing to individual storage elements during a write operation to the wordline 1328.

The read/write circuitry 1360 may read bits from the data latches 1362 and apply selection signals (e.g., at least partially based on the bit mask) to control lines coupled to the word lines 1320-1328, the bit lines 1330-1334, and the source lines 1340-1342 to cause a programming voltage (e.g., a voltage pulse or series of voltage pulses) to be applied across selected storage element(s) of the selected word line (e.g., the fourth word line 1328). The read/write circuitry 1360 may be configured to disable skipping of writing one or more values and may support the in-place refresh command 180 of FIG. 1. Note that for NAND memory (unlike ReRAM memory and other symmetric memories) the refreshing may be effective for cells which drifted to a lower threshold voltage but may not be effective for cells which drifted to a higher threshold voltage, as conventional NAND programming shifts cells to higher threshold voltages and does not shift cells to lower threshold voltages.

During a read operation, the controller 120 may receive a request from a host device, such as the host device 130 of FIG. 1. The controller 120 may cause the read/write circuitry 1360 to read bits from particular storage elements of the 3D memory 1300 by applying appropriate signals to the control lines to cause storage elements of a selected word line to be sensed. The logical values read from the storage elements of the selected word line may be saved at the data latches 1362 and provided to the controller 120.

Although various components depicted herein are illustrated as block components and described in general terms, such components may include one or more microprocessors, state machines, or other circuits configured to enable the data storage device 102 to perform one or more operations described herein. For example, the skipping logic 144 may represent physical components, such as hardware controllers, state machines, logic circuits, or other structures, to enable the write circuitry 142 to skip writing a data value to the non-volatile memory 103. The disable flag 146 may correspond to a value maintained by a state machine that is responsive to one or more commands received from the controller 120, such as the command 172, the in-place refresh command 180, the write command 182, and/or the write-all command 184. The non-volatile memory 103 may include one or more state machines or other circuits that enable the non-volatile memory 103 to perform one or more operations of the methods 300, 400, 500, and 600.

Alternatively, or in addition, one or more components of the data storage device 102 may be implemented using a microprocessor or microcontroller programmed to perform one or more operations described herein. To illustrate, operations corresponding to one or both of the RNG 170 or the counter 174 may be implemented using a processor that executes instructions, as illustrative examples. In a particular embodiment, the instructions are stored at the non-volatile memory 103. Alternatively, or in addition, executable instructions that are executed by the processor may be stored at a separate memory location that is not part of the non-volatile memory 103, such as at a read-only memory (ROM).

In a particular embodiment, the data storage device 102 may be attached to or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. However, in other embodiments, the data storage device 102 may be implemented in a portable device configured to be selectively coupled to one or more external devices.

The host device 130 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 130 may communicate via a host controller, which may enable the host device 130 to communicate with the data storage device 102. The host device 130 may operate in compliance with a JEDEC Solid State Technology Association industry specification, such as an embedded MultiMedia Card (eMMC) specification or a Universal Flash Storage (UFS) Host Controller Interface specification. The host device 130 may operate in compliance with one or more other specifications, such as a Secure Digital (SD) Host Controller specification as an illustrative example. Alternatively, the host device 130 may communicate with the data storage device 102 in accordance with another communication protocol.

The non-volatile memory 103 may have a two-dimensional configuration, a three-dimensional (3D) configuration (e.g., a 3D memory), or any other configuration, and may include a single die or multiple dies (e.g., multiple stacked memory dies). The data storage device 102 may be configured to be coupled to the host device 130 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination Thereof.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and the multiple strings are accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device including a non-volatile memory configured to, responsive to receiving a write command to write data including a "0" value and a "1" value to a particular location, skip writing at least one value of the "0" value and the "1" value into a storage element when the storage element already contains the at least one value, performing:
receiving by the non-volatile memory a single in-place refresh command to refresh the data at the particular location in the non-volatile memory; and
in response to the single in-place refresh command, executing an in-place refresh operation by:
reading the data from the particular location,
performing one or more write operations on the particular location such that each storage element of the particular location is programmed at least once without being skipped, and
writing the data to the particular location.

2. The method of claim 1, wherein the non-volatile memory includes a resistive random access memory (ReRAM).

3. The method of claim 1, wherein executing the in-place refresh operation includes reading the data from the particular location to a latch on the non-volatile memory and writing the data from the latch into the particular location.

4. The method of claim 1, wherein the particular location corresponds to a page.

5. The method of claim 1, wherein the particular location corresponds to a block.

6. The method of claim 5, wherein re-writing the data includes performing a page-by-page refresh of the data in the block.

7. The method of claim 1, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

8. A method comprising:
in a data storage device including a non-volatile memory that is configured, for at least one value from the group containing the values zero and one, to execute a write command to write data including a "0" value and a "1" value to a particular location by skipping writing of the at least one value of the "0" value and the "1" value into a storage element based on determining that the storage element already stores the at least one value, performing:
receiving by the non-volatile memory a single in-place refresh command to refresh the data at the particular location in the non-volatile memory; and
in response to the single in-place refresh command,
disabling the skipping writing of the at least one value for the particular location, and
re-writing the data into the particular location of the non-volatile memory to refresh the data at the particular location, wherein the re-writing includes for each storage element of the particular location for which the data is equal to the at least one value, writing the at least one value into the storage element in response to the disabled skipping.

9. The method of claim 8, wherein the non-volatile memory includes a resistive random access memory (ReRAM).

10. The method of claim 8, wherein re-writing the data includes bringing the storage elements of the particular location to a same value prior to writing the data to the storage elements of the particular location.

11. The method of claim 8, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

12. A method comprising:
in a data storage device including a non-volatile memory, performing:
receiving by the non-volatile memory an in-place refresh command to refresh data at a particular location in the non-volatile memory;
performing one or more write operations on the particular location such that each storage element of the particular location is programmed at least once without being skipped; and
in response to the in-place refresh command, re-writing the data into the particular location of the non-volatile memory to refresh the data at the particular location,
wherein performing the one or more write operations includes bringing the storage elements of the particular location to a first common value and bringing the storage elements of the particular location to a second common value different from the first common value prior to writing the data to the storage elements of the particular location.

13. The method of claim 12, wherein the non-volatile memory includes a resistive random access memory (ReRAM).

14. The method of claim 12, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

15. A method comprising:
in a memory device that is configurable, for at least one value from the group containing the values zero and one, to skip writing the at least one value into a storage element when the storage element already contains the at least one value, performing:
receiving, from a controller, a write command to write data including a "0" value and a "1" value into a particular location in a non-volatile memory;
in response to receiving the write command, determining whether to write the data according to a first mode that skips writing the at least one value into storage elements based on the storage elements already storing the at least one value or according to a second mode that writes the at least one value into the storage elements that already store the at least one value; and
performing one or more write operations on the particular location in the second mode such that each storage element of the particular location is programmed at least once without being skipped.

16. The method of claim 15, wherein the non-volatile memory includes a resistive random access memory (ReRAM).

17. The method of claim 15, wherein determining whether to write the data according to the first mode or according to the second mode is based on a counter value that indicates a number of write operations that have been performed at the particular location according to the first mode since a most recent write operation was performed at the particular location according to the second mode.

18. The method of claim 15, wherein determining whether to write the data according to the first mode or according to the second mode is based on a probabilistic decision.

19. The method of claim 15, wherein the non-volatile memory includes a three-dimensional (3D) memory configuration that is monolithically formed in one or more physical levels of arrays of memory cells having an active area disposed above a silicon substrate, and wherein the memory device includes circuitry associated with operation of the memory cells.

20. A method comprising:
in a storage device that includes a controller and a memory device that is configurable, for at least one value from the group containing the values "0" and "1", to skip writing the at least one value into a storage element when the storage element already contains the at least one value, performing:
receiving, by the controller, a write command to write data including a "0" value and a "1" value into a particular location in a non-volatile memory;
in response to receiving the write command, determining by the controller whether to write the data according to a first mode that skips writing the at least one value into storage elements based on the storage elements already storing the at least one value or according to a second mode that writes the at least one value into the storage elements that already store the at least one value; and
performing one or more write operations on the particular location in the second mode such that each storage element of the particular location is programmed at least once without being skipped.

21. The method of claim 20, wherein the non-volatile memory includes a resistive random access memory (ReRAM).

22. The method of claim 20, wherein determining whether to write the data according to the first mode or according to the second mode is based on a counter value that indicates a number of write operations that have been performed at the particular location according to the first mode since a most recent write operation was performed at the particular location according to the second mode.

23. The method of claim 20, wherein determining whether to write the data according to the first mode or according to the second mode is based on a probabilistic decision.

24. The method of claim 20, wherein the non-volatile memory includes a three-dimensional (3D) memory configuration that is monolithically formed in one or more physical levels of arrays of memory cells having an active area disposed above a silicon substrate, and wherein the memory device includes circuitry associated with operation of the memory cells.

25. A method comprising:
in a data storage device including a non-volatile memory that is configured, for at least one value from the group containing the values zero and one, to execute a write command by skipping writing of the at least one value into a storage element when the storage element already contains the at least one value, performing:
receiving by the non-volatile memory a write-all command to write data at a particular location in the non-volatile memory;
in response to the write-all command, disabling the skipping writing of the at least one value for the particular location; and
in response to the write-all command, writing the data into the particular location without skipping writing of the storage elements of the particular location that already contain the at least one value.

26. The method of claim 25, wherein the non-volatile memory includes a resistive random access memory (ReRAM).

27. The method of claim 25, wherein writing the data includes bringing the storage elements of the particular location to a common value prior to writing the data to the storage elements of the particular location.

28. The method of claim 25, wherein the write-all command is received as a prefix preceding a write command.

29. The method of claim 25, wherein an opcode of the write-all command matches an opcode of the write command, and wherein the write-all command includes a flag that is received following the opcode and that distinguishes the write-all command from the write command.

30. The method of claim 25, wherein an opcode of the write-all command matches an opcode of the write command, and wherein a flag in the non-volatile memory distinguishes the write-all command from the write command.

31. The method of claim 25, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

32. A method comprising:
in a data storage device including a non-volatile memory, performing:
receiving a write-all command to write data at a particular location in the non-volatile memory;
performing one or more write operations on the particular location such that each storage element of the particular location is programmed at least once without being skipped in response to the write-all command; and
in response to the write-all command, writing the data into the particular location, wherein performing the one or more write operations includes bringing the storage elements of the particular location to a first common value and bringing the storage elements of the particular location to a second common value different from the first common value prior to writing the data to the storage elements of the particular location.

33. The method of claim 32, wherein the non-volatile memory includes a resistive random access memory (ReRAM).

34. The method of claim 32, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

35. A data storage device comprising:
a non-volatile memory configured to, responsive to receiving a write command to write data including a "0" value and a "1" value to a particular location, skip writing at least one value of the "0" value and the "1" value into a storage element when the storage element already contains the at least one value; and
circuitry configured, in response to the non-volatile memory receiving a single in-place refresh command to refresh the data at the particular location in the non-volatile memory, to execute an in-place refresh operation by:
reading the data from the particular location;
performing one or more write operations on the particular location such that each storage element of the particular location is programmed at least once without being skipped; and
writing the data to the particular location.

36. The data storage device of claim 35, wherein the non-volatile memory includes a resistive random access memory (ReRAM).

37. The data storage device of claim 35, wherein the non-volatile memory further includes a latch, and wherein re-writing the data includes reading the data from the particular location to the latch and writing the data from the latch in response to receiving the in-place refresh command.

38. The data storage device of claim 35, wherein the particular location corresponds to a page.

39. The data storage device of claim 35, wherein the particular location corresponds to a block.

40. The data storage device of claim 39, wherein re-writing the data includes performing a page-by-page refresh of the data in the block.

41. The data storage device of claim 35, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

42. A data storage device comprising:
a non-volatile memory; and
write circuitry that is configured, for at least one value from the group containing the values zero and one, to execute a write command to write data including a "0" value and a "1" value to a particular location by skipping writing of the at least one value of the "0" value and the "1" value into a storage element when the storage element already stores the at least one value,
wherein in response to the non-volatile memory receiving a single in-place refresh command to refresh the data at the particular location in the non-volatile memory, the write circuitry is configured to re-write the data into the particular location of the non-volatile memory to refresh the data at the particular location, wherein re-writing the data includes for each storage element of the particular location for which the data is equal to the at least one value, writing the at least one value into the storage element by disabling the skipping writing of the at least one value for the particular location.

43. The data storage device of claim 42, wherein the non-volatile memory includes a resistive random access memory (ReRAM).

44. The data storage device of claim 42, wherein re-writing the data includes bringing the storage elements of the particular location to a same value prior to writing the data to the storage elements of the particular location.

45. The data storage device of claim 42, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

46. A data storage device comprising:
a non-volatile memory; and
write circuitry that is configured, in response to the non-volatile memory receiving an in-place refresh command to refresh data at a particular location in the non-volatile memory, to re-write the data into the particular location of the non-volatile memory to refresh the data at the particular location, wherein re-writing the data includes performing two or more write operations on the particular location such that each storage element of the particular location is programmed at least once without being skipped, performing the two or more write operations bringing the storage elements of the particular location to a first common value and bringing the storage elements of the particular location to a second common value different from the first common value prior to writing the data to the storage elements of the particular location.

47. The data storage device of claim 46, wherein the non-volatile memory includes a resistive random access memory (ReRAM).

48. The data storage device of claim 46, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

49. A data storage device comprising:
a non-volatile memory; and
write circuitry that is configurable, for at least one value from the group containing the values zero and one, to skip writing the at least one value into a storage element of the non-volatile memory when the storage element already contains the at least one value, and
wherein, in response to receiving a write command from a controller to write data including a zero value and a one value into a particular location in a non-volatile memory, the write circuitry is further configured to determine whether to write data according to a first mode that skips writing the at least one value into storage elements based on the storage elements already storing the at least one value or according to a second mode that writes the at least one value into the storage elements that already store the at least one value by disabling the skipping of writing of the at least one value in the second mode.

50. The data storage device of claim 49, wherein the non-volatile memory includes a resistive random access memory (ReRAM).

51. The data storage device of claim 49, wherein determining whether to write the data according to the first mode or according to the second mode is based on a counter value that indicates a number of write operations that have been performed at the particular location according to the first mode since a most recent write operation was performed at the particular location according to the second mode.

52. The data storage device of claim 49, wherein determining whether to write the data according to the first mode or according to the second mode is based on a probabilistic decision.

53. The data storage device of claim 49, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

54. A data storage device comprising:
a controller; and
a non-volatile memory coupled to the controller, the non-volatile memory including write circuitry that is configurable, for at least one value from the group containing the values "0" and "1", to skip writing the at least one value into a storage element of the non-volatile memory when the storage element already contains the at least one value, and
wherein, in response to receiving a write command to write data including a "0" value and a "1" value into a particular location in the non-volatile memory, the controller is configured to determine whether to write the data according to a first mode that skips writing the at least one value into storage elements based on the storage elements already storing the at least one value or according to a second mode that writes the at least one value into the storage elements that already store the at least one value by one or more of:
disabling the skipping of writing the at least one value in the second mode, and
performing one or more write operations on the particular location in the second mode such that each storage element of the particular location is programmed at least once without being skipped.

55. The data storage device of claim 54, wherein the non-volatile memory includes a resistive random access memory (ReRAM).

56. The data storage device of claim 54, wherein determining whether to write the data according to the first mode or according to the second mode is based on a counter value that indicates a number of write operations that have been performed at the particular location according to the first mode since a most recent write operation was performed at the particular location according to the second mode.

57. The data storage device of claim 54, wherein determining whether to write the data according to the first mode or according to the second mode is based on a probabilistic decision.

58. The data storage device of claim 54, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

59. A data storage device comprising:
a non-volatile memory; and
write circuitry configured, for at least one value of the group containing the values zero and one, to execute a write command by skipping writing of the at least one value into a storage element of the non-volatile memory when the storage element already contains the at least one value,
wherein in response to the non-volatile memory receiving a write-all command from a controller to write data at a particular location in the non-volatile memory, the write circuitry is configured to write the data into the particular location without skipping writing of the storage elements of the particular location that already contain the at least one value by performing one or more write operations on the particular location such that each storage element of the particular location is programmed at least once without being skipped.

60. The data storage device of claim 59, wherein the non-volatile memory includes a resistive random access memory (ReRAM).

61. The data storage device of claim 59, wherein performing the one or more write operations includes bringing the storage elements of the particular location to a common value prior to writing the data to the storage elements of the particular location.

62. The data storage device of claim 59, wherein the write circuitry is configurable to disable skipping of writing the at least one value by performing the one or more write operations.

63. The data storage device of claim 59, wherein the write-all command is received as a prefix preceding a write command.

64. The data storage device of claim 59, wherein an opcode of the write-all command matches an opcode of the write command, and wherein the write-all command includes a flag that is received following the opcode and that distinguishes the write-all command from the write command.

65. The data storage device of claim 59, wherein an opcode of the write-all command matches an opcode of the write command, wherein the non-volatile memory includes a flag, and wherein the non-volatile memory is configured to distinguish the write-all command from the write command according to the flag.

66. The data storage device of claim 59, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

67. A data storage device comprising:
a non-volatile memory; and
write circuitry that is configured, in response to receiving a write-all command to write data at a particular location in the non-volatile memory, to perform one or more write operations on the particular location such that each storage element of the particular location is programmed at least once without being skipped and to write the data to the particular location, wherein performing the one or more write operations includes bringing the storage elements of the particular location to a first common value and bringing the storage elements of the particular location to a second common value different from the first common value prior to writing the data to the storage elements of the particular location.

68. The data storage device of claim 67, wherein the non-volatile memory includes a resistive random access memory (ReRAM).

69. The data storage device of claim 67, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

\* \* \* \* \*